United States Patent
Nguyen

(10) Patent No.: US 10,184,493 B2
(45) Date of Patent: Jan. 22, 2019

(54) PIEZO FLAPPING FAN

(71) Applicant: Tung Thanh Nguyen, San Jose, CA (US)

(72) Inventor: Tung Thanh Nguyen, San Jose, CA (US)

( * ) Notice: Subject to any disclaimer, the term of this patent is extended or adjusted under 35 U.S.C. 154(b) by 101 days.

(21) Appl. No.: 15/432,937

(22) Filed: Feb. 15, 2017

(65) Prior Publication Data

US 2017/0254336 A1    Sep. 7, 2017

Related U.S. Application Data

(60) Provisional application No. 62/303,379, filed on Mar. 4, 2016.

(51) Int. Cl.

| | | |
|---|---|---|
| *F04D 33/00* | (2006.01) | |
| *H01L 23/467* | (2006.01) | |
| *F04D 25/06* | (2006.01) | |
| *F04D 29/02* | (2006.01) | |
| *H01L 23/367* | (2006.01) | |
| *F04B 43/04* | (2006.01) | |

(52) U.S. Cl.
CPC ............ *F04D 33/00* (2013.01); *F04B 43/046* (2013.01); *F04D 25/06* (2013.01); *F04D 29/023* (2013.01); *H01L 23/3672* (2013.01); *H01L 23/467* (2013.01)

(58) Field of Classification Search
CPC ...................................................... F04D 33/00
See application file for complete search history.

(56) References Cited

U.S. PATENT DOCUMENTS

| | | | | |
|---|---|---|---|---|
| 4,595,338 | A * | 6/1986 | Kolm ...................... | F04D 33/00 310/330 |
| 5,008,582 | A * | 4/1991 | Tanuma ................ | H01L 23/467 257/E23.099 |
| 2002/0175596 | A1* | 11/2002 | Garimella ............... | F04D 33/00 310/328 |
| 2011/0120679 | A1* | 5/2011 | Tanaka ................... | F04D 33/00 165/121 |
| 2011/0150669 | A1* | 6/2011 | Frayne ................... | F04B 35/045 417/53 |
| 2016/0048180 | A1* | 2/2016 | Woo ........................ | G06F 1/206 361/679.48 |

OTHER PUBLICATIONS

Sitti et al.; Development of PCT and PZN-PT Based Unimorph Actuators for Micromechanical Flapping Mechanisms; May 2001; IEEE International Conference on Robotics & Automation; pp. 3839-3846.*

* cited by examiner

*Primary Examiner* — Daniel J Colilla

(57) ABSTRACT

A flapping fan for cooling electronic devices includes an elongated piezo actuator, two supporting members, two connecting members, and a thin blade. The supporting members are attached to the piezo actuator at its two ends, while the blade is connected to the piezo actuator through the connecting members. When activated by an AC signal, the piezo actuator oscillates around its neutral position, which causes the blade to oscillate. The blade rotates around its leading edge when its direction of motion changes, keeping its angle of incidence lower than ninety degrees. This helps the flapping fan to generate a significant air flow.

10 Claims, 4 Drawing Sheets

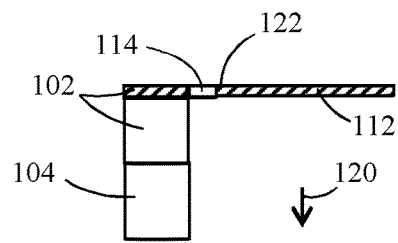
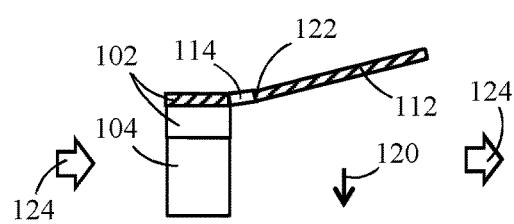
FIG. 2A  FIG. 2B
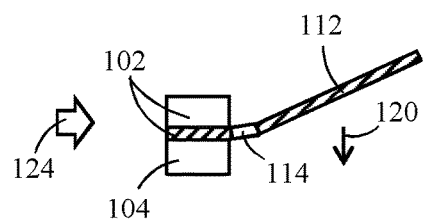
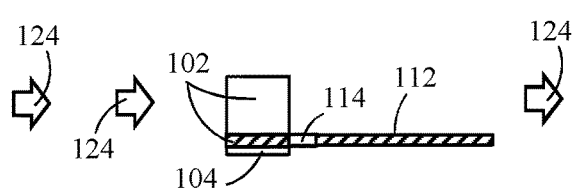
FIG. 2C  FIG. 2D
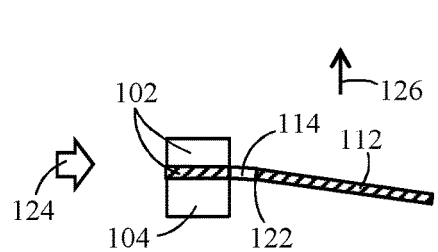
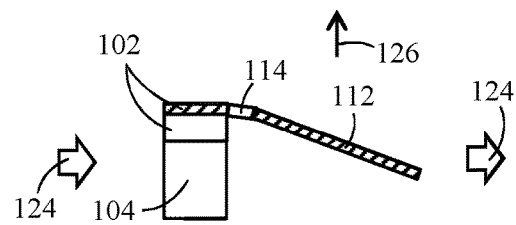
FIG. 2E  FIG. 2F
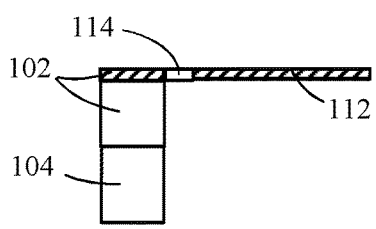
FIG. 2G

PIEZO FLAPPING FAN

This application claims the benefit of U.S. provisional application No. 62/303,379 filed Mar. 4, 2016, which application is incorporated herein by reference in its entirety.

FIELD

The present invention relates to a flapping fan, and more particularly concerns an piezo flapping fan for cooling electronic devices.

BACKGROUND

Many components in an electronic package such as CPU, GPU, and LED light dissipate significant heat during operation, which increases the temperature of the package. This may negatively affect user experience, performance and reliability of the package. A rotary fan blowing air across high temperature regions is usually used for cooling purpose. However, the rotary fan has many disadvantages. It is generally noisy and heavy. Its efficiency and reliability are relatively low. When heavily used the fan usually fails after two to three years, and thus, cannot be used for many applications such as telecommunication and LED cooling. Moreover, it includes moving parts such as bearings and stator coils making it difficult to miniaturize.

Another type of fan is piezo (or piezoelectric) fan, which typically includes a piezo actuator attached to an elongated cantilever blade (as seen in, for example, U.S. Pat. No. 4,780,062, U.S. Pat. No. 4,923,000, U.S. Pat. No. 5,861,703, U.S. Pat. No. 7,061,161, U.S. Pat. No. 7,642,698, U.S. 2007/0090726 A1, U.S. 2011/0014069 A1, U.S. Pat. No. 8,322,889, and U.S. Pat. No. 8,581,471). The piezo fan has many advantages over the conventional rotary fan; it is simple, reliable, quiet and lightweight. When oscillating around its neutral position the blade forces the ambient air back and forth (or in and out) enhancing the rate of convective heat transfer between the air and the hot surfaces of the heated components. This fan may be useful for spot cooling in low power applications. Unfortunately, aerodynamic efficiency of the fan is very low. The fan generates very little net air flow, which greatly limits its applications.

Accordingly, the need still exists for a fan that is quiet, reliable, efficient, lightweight, and able to generate significant net air flow in a desired direction.

SUMMARY

This invention relates to an piezo flapping fan for cooling electronic packages which includes two supporting members, an elongated piezo actuator and a thin blade. The piezo actuator is supported by the supporting members at each end through two living hinges, while the blade is mechanically connected to the central portion of the piezo actuator through two connecting members. The piezo actuator comprises at least one layer of electro-active material. When activated by an AC signal, the piezo actuator oscillates around its original (neutral) position, inducing the blade to oscillate. Due to the aerodynamic drag force and inertial force acting on the blade when it oscillates, the blade rotates about its leading edge when its direction of motion changes, keeping its angle of incidence lower than ninety degrees in both downstroke and upstroke. This hummingbird-like flapping wing mechanism allows the fan to generate a significant net air flow.

The fan can be used in a conjunction with a heat sink to form a cooling device. Moreover, several flapping fans can be arranged in series or parallel to increase the overall performance.

The flapping fan is very lightweight. There is no bearing, no mechanical friction in this fan, allowing it to have high reliability and high efficiency. The simple structure makes it easy to manufacture. More importantly, it is able to generate a significant air flow for cooling purpose. The fan can be conveniently miniaturized and tailored to have suitable profiles for different applications such as cooling fans for laptops, LEDs and data centers.

BRIEF DESCRIPTION OF THE DRAWINGS

A complete understanding of the present invention may be obtained by reference to the accompanying drawings, when considered in conjunction with the subsequent detailed description, in which:

FIGS. 2A-2G are cross-sectional views taken along line 1-1 of FIG. 1B demonstrating the flapping mechanism of the blade during an oscillating cycle;

DETAILED DESCRIPTION

The present invention will now be described in full details with reference to the accompanying drawings in which example embodiments of the claimed invention are shown.

Figure 1A:
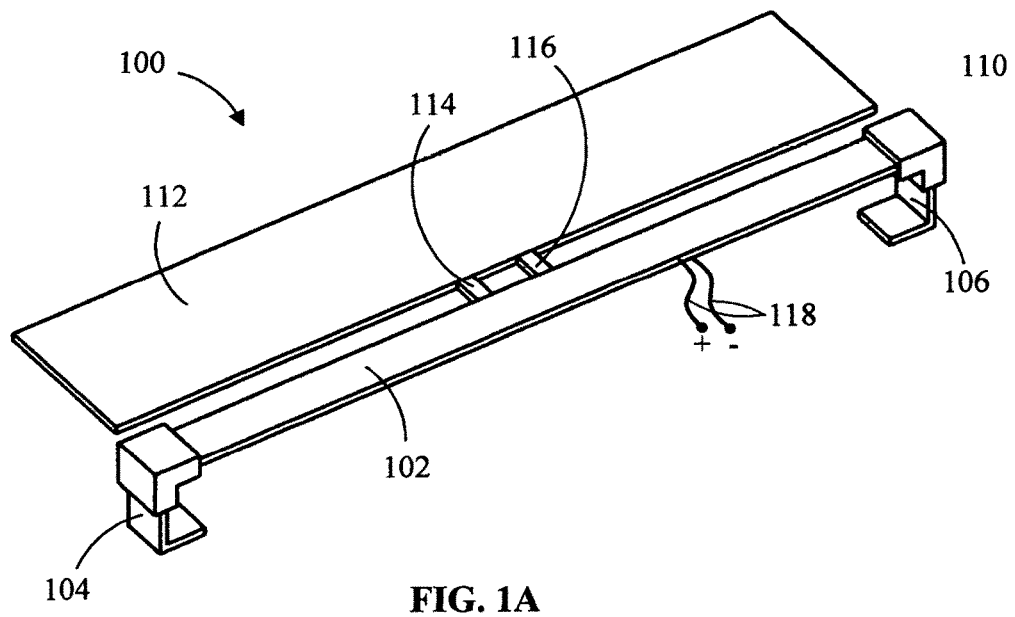
FIG. 1A is a perspective view of an embodiment of a flapping fan according to this invention.
Figure 1B:
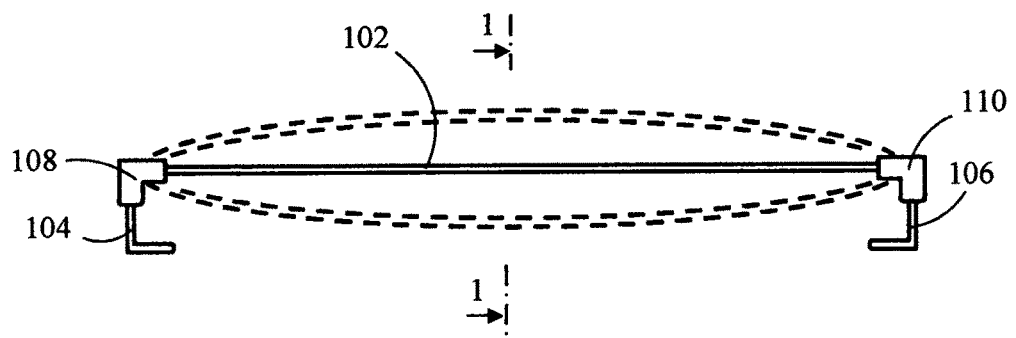
FIG. 1B is a front view of the flapping fan of FIG. 1A.

Referring to FIG. 1A, a flapping fan according to a first embodiment of this invention is provided. This invention comprises a flapping fan 100 suitable for use in an electronic device for cooling purpose. The flapping fan 100 includes an elongated piezo actuator 102. Two ends of the piezo actuator 102 are attached to two supporting members 104, 106, which are arranged perpendicular to the piezo actuator 102, through two connecting members 108, 110. Connecting members 108, 110 act as living hinges between the actuator 102 and the supporting members 104, 106. This simply supported boundary condition allows the piezo actuator 102 to have maximum deflection. The connecting members 108, 110 can be made of an elastomer material such as silicon or polyurethane rubber using liquid rubber overmolding technique. When the fan 102 is used in an application, the bottom of the supporting members 104, 106 will be fixed or integrated to another rigid structure, for example a heatsink. The supporting members 104, 106 can be made as a thin structure of a plastic such as nylon using plastic injection molding technique. A thin blade 112 is arranged parallel to the piezo actuator 102. They are connected to each other through two identical connecting members 114, 116 located near the central portion of the flapping fan 100. The connecting members 114, 116 can be made as a thin layer of a durable material such as steel or carbon fiber composite. The piezo actuator 102 is driven by an AC power supply (not shown) through two conductive wires 118. The piezo actuator 102 is a unimorph or bimorph actuator, which comprises at least one layer of an electro active material. One example of the unimorph actuator is a cantilever structure that includes a thin layer of PZT glued to a thin of layer of steel using a non-conductive epoxy layer. The unimorph can also be a composite which includes at least one piezo active layer and several other layers of fiber-reinforced composite materials. The operating mechanism of these unimorph actuators can be described as follows. When an AC electric field is applied the piezo layer expanses and contracts in plane. As the other layer in the unimorph constrains this displacement, the internal stress is built up inside each layer, resulting in deflection (out of plane) of the unimorph. The AC signal may have a sinusoidal or a customized shape which includes a ramp-up, ramp-down, and dwell periods within a cycle. Various AC frequencies from several Hz to a couple of hundred Hz may be used. Significant deflection of the unimorph can be achieved by operating the unimorph near its first natural frequency, so that resonance occurs. A piezo single crystal layer, which has a very high piezoelectric constant (d31), can be used if higher deflection of the actuator 102 is desired. FIG. 1B shows a front view of the flapping fan 100. The dotted lines in FIG. 1B demonstrate the oscillations of the piezo actuator 102 when activated. The piezo actuator 102 deflects up and down, driving the blade 112 to oscillate around its neutral position in vertical direction. The blade 112 can be made as a thin lightweight composite structure, for example a nylon or silk fabric membrane with branching veins and frame of carbon/epoxy.

FIGS. 2A-2G demonstrate the oscillating sequence of the blade 112 during one cycle. During a downstroke (see FIGS. 2A-2D), the actuator 102 deflects down in vertical direction 120 from its highest position pulling the blade 112 along with it. The aerodynamic drag and inertial forces acting on the blade 112 cause it to rotate about its leading edge 122. As the result, the angle of incidence of the blade 112 remains lower than ninety degrees during the downstroke. This induces an air flow from left to right direction 124. Similarly, during an upstroke 126 (see FIGS. 2D-2G) the angle of incidence of the blade 112 also remains lower than ninety degrees, which allows the fan to generate an air flow in the same direction 124. This operating mechanism, which is very similar to that of hummingbird's flapping wing in the way that the blade 112 rotates about its leading edge 122 between an upstroke and a downstroke, allows the fan 100 to generate a significant air flow with high aerodynamic efficiency. Stiffness of the connecting members 114, 116, which controls the angle of incidence of the blade 112, the size and weight of the blade 112 are among the key design parameters that need to be optimized. The optimization can be done using computational fluid dynamics (CFD) simulation.

Figure 3:
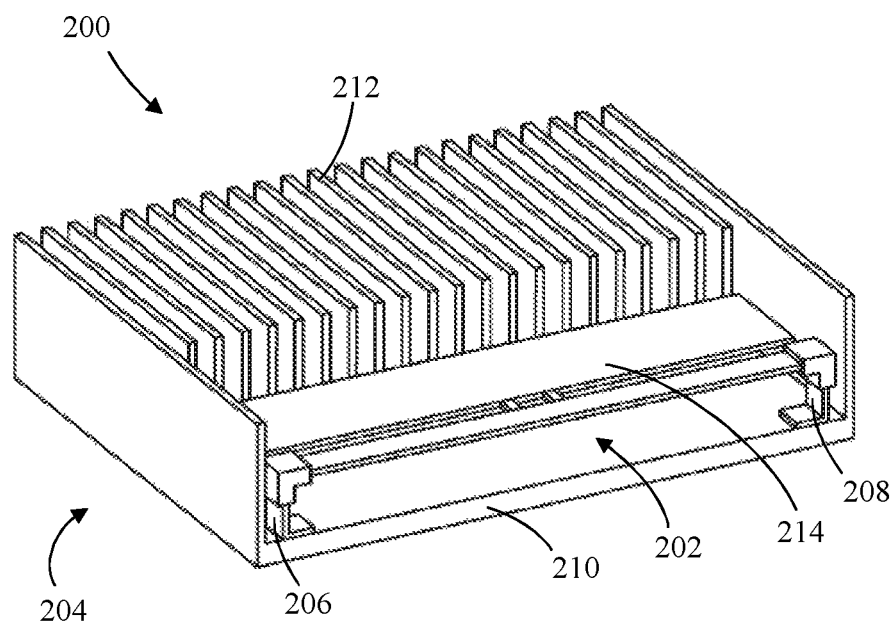
FIG. 3 is a perspective view of a cooling device which includes the flapping fan of FIG. 1A integrated in a heat sink.

The flapping fan of this invention can be used in conjunction with a heat sink to form a cooling device. FIG. 3 shows an example of such a device. The cooling device 200 includes a flapping fan 202 of FIG. 1A, and a heat sink 204. The supporting members 206, 208 of the fan 202 are attached to the base 210 of the heat sink 204. The attachment can be done using screws or an epoxy adhesive. The heat sink 204 has an array of fins 212 arranged perpendicular to the blade 214 of the fan 202. The heat sink 204 can be made of aluminum using extrusion method and further CNC machined to create a compartment for the fan 202

Figure 4:
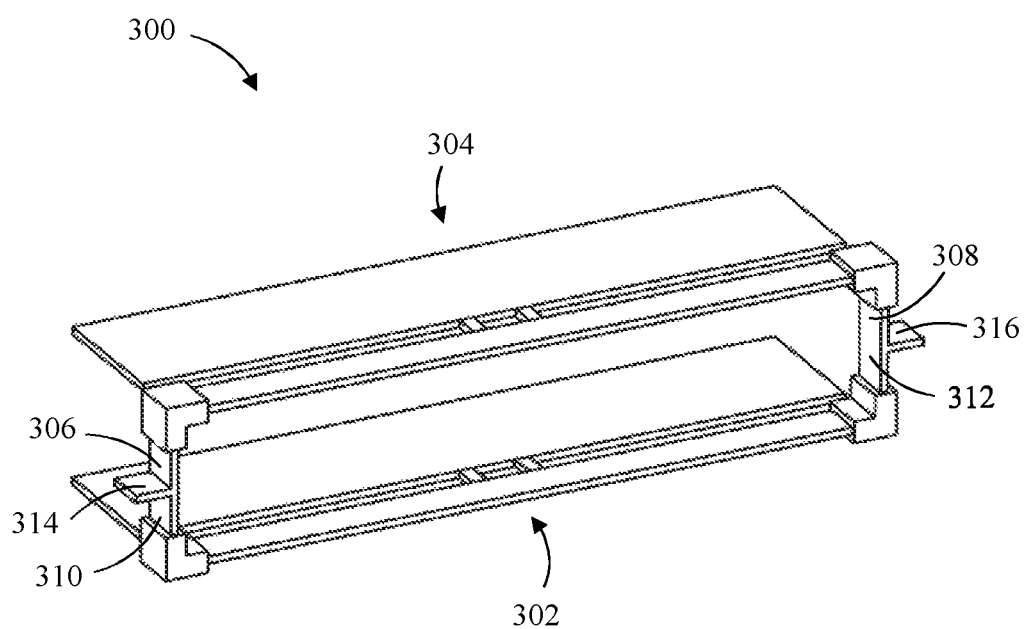
FIG. 4 is a perspective view of two identical flapping fans of FIG. 1A arranged in parallel.

Like rotary fans, more than one flapping fan of this invention can be arranged in parallel to improve the overall performance as shown in FIG. 4. The flapping fan 300 includes two identical flapping fans 302, 304 of FIG. 1A. The supporting members 306, 308 of the first fan 302 are connected to the supporting members 310, 312 of the second fan 304. The fan 300 has two legs 314, 316 arranged at the ends of its supporting members 306, 308, 310, 312, so that it can be attached to another structure when used in an application. The two fans 302, 304 can also be arranged in series (not shown) to increase the overall head pressure.

Unlike rotary fans, the flapping fan of this invention includes only a few simple parts, making it lightweight and easy to manufacture. As there is no bearing, no friction, and thus, no friction energy loss, the flapping fan is very reliable and efficient. Furthermore, the simple design enables miniaturization of the flapping fan. As piezo materials such as PZT can have high energy conversion efficiency, the flapping fan can have relatively low power consumption. More importantly, thanks to the flapping mechanism of its blade the fan is able to provide a significant air flow for cooling purpose.

Since other modifications and changes in the material, shape, size, and arrangement of the parts will be apparent to those skilled in the art, it has to be understood that the invention is not considered limited to the above described embodiments of this invention, and covers all changes and modifications which do not constitute departures from the true spirit and scope of this invention.

What is claimed is:

1. A flapping fan, comprising:
   an elongated piezo actuator;
   two supporting members arranged substantially perpendicular to said piezo actuator;
   two living hinges, each said living hinge mechanically connects each said supporting member to each end of said piezo actuator;
   a thin blade arranged parallel to said piezo actuator; and
   at least a connecting member mechanically connecting the leading edge of said blade to the central portion of said piezo actuator;
   whereby
   when activated by an AC signal said piezo actuator oscillates around its neutral position, driving said blade to oscillate, aerodynamic drag force and inertial force acting on said blade cause it to rotate around its leading edge when its direction of motion changes, and thus, generating a significant air flow in the same direction in both downstroke and upstroke of an oscillating cycle.

2. The flapping fan of claim 1, wherein said living hinges are made of silicon rubber.

3. The flapping fan of claim 1, wherein said blade is made of silk fabric with a carbon fiber frame.

4. The flapping fan of claim 3, wherein said blade is made using a laminated composite manufacturing technique.

5. A cooling device, comprising:
   a heat sink having an array of fins; and
   a flapping fan according to claim 1;
   whereby
   when powered by an AC signal said flapping fan generates an air flow across the fins of said heat sink, dissipating heat from said fins to the air.

6. A flapping fan, comprising:
   an elongated piezo actuator;
   two supporting members arranged substantially perpendicular to said piezo actuator, each said supporting member is attached to each end of said piezo actuator;
   a thin blade comprising a lightweight frame and a thin membrane attached to said frame, said thin blade being arranged parallel to said piezo actuator; and
   at least a connecting member mechanically connecting the leading edge of said blade to the central portion of said piezo actuator;
   whereby
   when activated by an AC signal said piezo actuator oscillates around its neutral position, driving said blade to oscillate, aerodynamic drag force and inertial force acting on said blade cause it to rotate around its leading edge when its direction of motion changes, and thus, generating a significant axial air flow in the same direction in both downstroke and upstroke of an oscillating cycle.

7. The flapping fan of claim 6, wherein said supporting members are attached to said piezo actuator using two silicone rubber living hinges.

8. The flapping fan of claim 6, wherein said frame is made of carbon fiber.

9. The flapping fan of claim 6, wherein said membrane is made of silk fabric.

10. The flapping fan of claim 6, wherein said blade is made using a laminated composite manufacturing technique.

* * * * *